US009425751B2

(12) United States Patent
Bushmaker (10) Patent No.: US 9,425,751 B2
(45) Date of Patent: Aug. 23, 2016

(54) SYSTEM LINEARIZATION ASSEMBLY AND METHOD FOR USE IN MODIFYING DISTORTION COMPONENTS

(71) Applicant: The Aerospace Corporation, ElSegundo, CA (US)

(72) Inventor: Adam Wayne Bushmaker, Los Angeles, CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 14/089,551

(22) Filed: Nov. 25, 2013

(65) Prior Publication Data

US 2015/0145595 A1    May 28, 2015

(51) Int. Cl.
| | | |
|---|---|---|
| *H03F 1/32* | (2006.01) | |
| *H03G 3/20* | (2006.01) | |
| *H03F 3/193* | (2006.01) | |
| *H03F 1/26* | (2006.01) | |

(52) U.S. Cl.
CPC .............. *H03F 3/193* (2013.01); *H03F 1/3205* (2013.01); *H03F 2200/15* (2013.01); *H03F 2200/18* (2013.01); *H03F 2200/321* (2013.01)

(58) Field of Classification Search
USPC .................. 330/149, 127, 279, 296–297, 285
See application file for complete search history.

(56) References Cited

U.S. PATENT DOCUMENTS

| | | | |
|---|---|---|---|
| 6,177,836 B1 | 1/2001 | Young et al. | |
| 6,320,461 B1 | 11/2001 | Lee | |
| 7,741,903 B2 * | 6/2010 | Vinayak et al. | ............... 330/127 |

FOREIGN PATENT DOCUMENTS

WO    WO 2011/061637 A1    5/2011

OTHER PUBLICATIONS

Dawson, Joel L; "Workshop on RF Circuits for 2.5G and 3G Wireless Systems"; *Power Amplifier Linearization Techniques: An Overview*; Feb. 4, 2001; 27 pages.
De Carvalho, N.B. and Pedro, J.C.; "Large Signal IMD Sweet Spots in Microwave Power Amplifiers" *Microwave Symposium Digest, 1999 IEEE MTI-S Digest.* (1999); pp. 517-520.
De Carvalho, Nuno Borges, et al; "Large- and Small-Signal IMD Behavior of Microwave Power Amplifiers"; *IEEE Transactions on Microwave Theory and Techniques*, vol. 47, No. 12; Dec. 1999; pp. 2364-2374.

(Continued)

*Primary Examiner* — Hieu Nguyen
(74) *Attorney, Agent, or Firm* — Manita Rawat; Duane Morris LLP (57) ABSTRACT

A system linearization assembly generally includes a filter that is coupled to a measuring device. The filter is configured to receive a signal that includes a time varying parameter representing a plurality of frequency components including at least one component caused by non-linear intermodulation distortion, such as an odd-order intermodulation distortion component. The filter is also configured to isolate at least one harmonic of the frequency components with the same order as the component caused by non-linear intermodulation distortion. The measuring device is configured to measure at least one parameter of the isolated harmonic. The system linearization assembly also includes a controller coupled to the measuring device. The controller is configured to modify, for example by minimizing, the signal from the determined measurement to facilitate a modification, such as a reduction, of the component caused by non-linear intermodulation distortion.

22 Claims, 3 Drawing Sheets

(56) References Cited

OTHER PUBLICATIONS

Fager, Christian, et al; "Prediction of IMD in LDMOS Transistor Amplifiers Using a New Large-Signal Model"; *IEEE Transactions on Microwave Theory and Techniques*, vol. 50, No. 12, Dec. 2002; pp. 2834-2842.

Joshin, Kazukiyo, et al; "Harmonic Feedback Circuit Effects on Intermodulation Products and Adjacent Channel Leakage Power in HBT Power Amplifier for 1.95 GHz Wide-Band CDMA Cellular Phones"; *IEICE TRANS. Electron.*, vol. E82-C, No. 5; May 1999; pp. 725-772.

Kang, Jongchan, et al.; "A Highly Linear and Efficient Differential CMOS Power Amplifier With Harmonic Control"; *IEEE Journal of Solid-State Circuits*, vol. 41, No. 6; Jun. 2006; pp. 1314-1322.

Lee, Chien-Ping, et al.; "Averaging and Cancellation Effect of High-Order Nonlinearity of a Power Amplifier"; IEEE Transactions on Circuits and Systems—I: Regular Papers, vol. 54, No. 12; Dec. 2007; pp. 2733-2740.

Miers, T. H. and Hirsch, V. A.; "A Thorough Investigation of Dynamic Bias on Linear GAM FET Power Amplifier Performance"; *IEEE MTT-S Digest*; (1992); pp. 537-540.

\* cited by examiner

SYSTEM LINEARIZATION ASSEMBLY AND METHOD FOR USE IN MODIFYING DISTORTION COMPONENTS

STATEMENT OF GOVERNMENT INTEREST

This invention was made with government support under Contract No. FA8802-09-C-0001 awarded by the Department of the Air Force. The government has certain rights in this invention.

BACKGROUND

The embodiments described herein relate generally to systems that effect a transfer function on an input signal to produce an output signal that ideally has a predetermined relationship to the input signal, such as amplifier systems, and, more particularly, to a system linearization assembly that may be used with such signal handling systems.

Signal processing systems, such as amplifier systems, are configured to modify or change at least one parameter of a signal. For example, an amplifier system may be configured to receive an input signal and to increase the amplitude of the signal, preferably without inducing other changes to the signal in the process. The amplified signal or the output signal can then be transmitted to a transmission line or to an antenna, for example.

However, at least some amplifier circuits and similar systems exhibit at least some form of nonlinear behavior, which may result in a distortion of the amplified or output signal. Such a distortion may decrease the overall performance of the amplifier system. For example, a harmonic distortion in an electronic amplifier introduces abnormalities in the output signal at the fundamental input frequency (w) and at multiples of the input frequency (2w, 3w, etc.) that constitute the inherent distortion. Some harmonic distortion can be filtered out by using bandpass filters. Intermodulation distortions (IMD), however, include the difference of the frequencies in the output, and can be difficult to filter out of the amplified or output signal. More specifically, in the case of two closely spaced input signals ($w_1$ and $w_2$), the resulting intermodulation (IMD) component frequency for a $3^{rd}$ order intermodulation (IM3) and other odd terms is immediately adjacent to the signals. When the resulting IMD component frequency is immediately adjacent to the signals in the frequency spectrum, it can be difficult to filter out. The intensity of an $n^{th}$ order intermodulation distortion component is proportional to the intensity of the $n^{th}$ order harmonic distortion component, provided the impedance of the output circuit is the same at both frequencies.

At least some methods have been proposed for linearization of amplified or output signals. For example, one method is known as the "power backoff" method. The idea is to reduce the amplifier gain when the input amplitude becomes large, so as to avoid driving the amplifier output into distortion. (A related technique is to boost the gain at low input amplitude to keep the amplified signal above a noise background level.) Such techniques control distortion and noise at the expense of amplification efficiency. Other known methods include pre-distortion and post-distortion methods to cancel the effect of the amplifier's non-linearity.

These conventional methods seek to minimize the adverse effects of the non-linearity but fail to correct the nonlinearity of the amplifier itself. Instead, such methods merely "cover" or "patch" the non-linearity such that the adverse effects of the non-linearity can be less apparent.

BRIEF DESCRIPTION

In one embodiment, a system linearization assembly is provided. The system linearization assembly generally includes a filter that is coupled to a measuring device. The filter is configured to receive a signal that includes a time varying parameter representing a plurality of frequency components including at least one component caused by non-linear intermodulation distortion, such as odd-order intermodulation distortion. The filter is also configured to isolate at least one harmonic of the frequency components with the same order as the component caused by non-linear intermodulation distortion. The measuring device is configured to measure at least one parameter of the isolated harmonic. The system linearization assembly also includes a controller coupled to the measuring device. The controller is configured to modify, such as by minimizing, the signal from the determined measurement to facilitate a modification, such as a reduction, of the component caused by non-linear intermodulation distortion.

In another embodiment, a signal processing system is provided. The signal processing system generally includes a signal modifying device that is configured to receive a signal from a signal source. The signal modifying device is also configured to modify the signal to generate a modified output signal ideally having a predetermined relationship to the signal from the signal source, such as a linearly amplified copy of the signal, wherein the modified output signal includes a time varying parameter representing a plurality of frequency components including at least one component caused by non-linear intermodulation distortion, such as odd-order intermodulation distortion. The signal processing system also includes a system linearization assembly that is coupled to the signal modifying device. The system linearization assembly includes a filter that is coupled to a measuring device. The filter is configured to receive the modified output signal. The filter is also configured to isolate at least one harmonic of the frequency components with the same order as the component caused by non-linear intermodulation distortion. The measuring device is configured to measure at least one parameter of the isolated harmonic. The system linearization assembly also includes a controller coupled to the measuring device. The controller is configured to modify, such as by minimizing the signal from the determined measurement to facilitate a modification, such as a reduction, of the component caused by non-linear intermodulation distortion.

In yet another embodiment, a method for modifying distortion components is provided. The method generally includes receiving a signal that includes a time varying parameter representing a plurality of frequency components including at least one component caused by non-linear intermodulation distortion, such as odd-order intermodulation distortion, via a filter. At least one harmonic of the frequency components with the same order as the component caused by non-linear intermodulation distortion is isolated, via the filter. A measurement of at least one parameter of the isolated harmonic is determined, via a measuring device that is coupled to the filter. The identified harmonic is modified, such as by minimization, based on the determined measurement to facilitate a modification, such as a reduction, of the component caused by non-linear intermodulation distortion, via a controller that is coupled to the measuring device.

DETAILED DESCRIPTION

The embodiments described herein include a system linearization assembly that can be used with signal processing systems, such as an amplifier system, to facilitate substantially reducing or minimizing non-linear intermodulation distortion components within the signals produced by the system. The system linearization assembly is configured to receive a signal, such as a modified or amplified signal, wherein the signal includes a time varying parameter representing a plurality of frequency components including at least one component caused by non-linear intermodulation distortion, such as odd-order intermodulation distortion. The system linearization assembly is further configured to isolate at least one harmonic of frequency components, such as at least one odd numbered harmonic, with the same order as the component caused by non-linear intermodulation distortion. The system linearization assembly is also configured to determine a measurement of at least one parameter of the isolated harmonic, and to modify the signal based on the determined measurement. Such a modification facilitates a reduction or minimization of the component caused by non-linear intermodulation distortion from the signal processing system by modifying the signal processing system itself rather than merely "covering" or "patching" the non-linear intermodulation distortion component to hide its effects.

Figure 1:
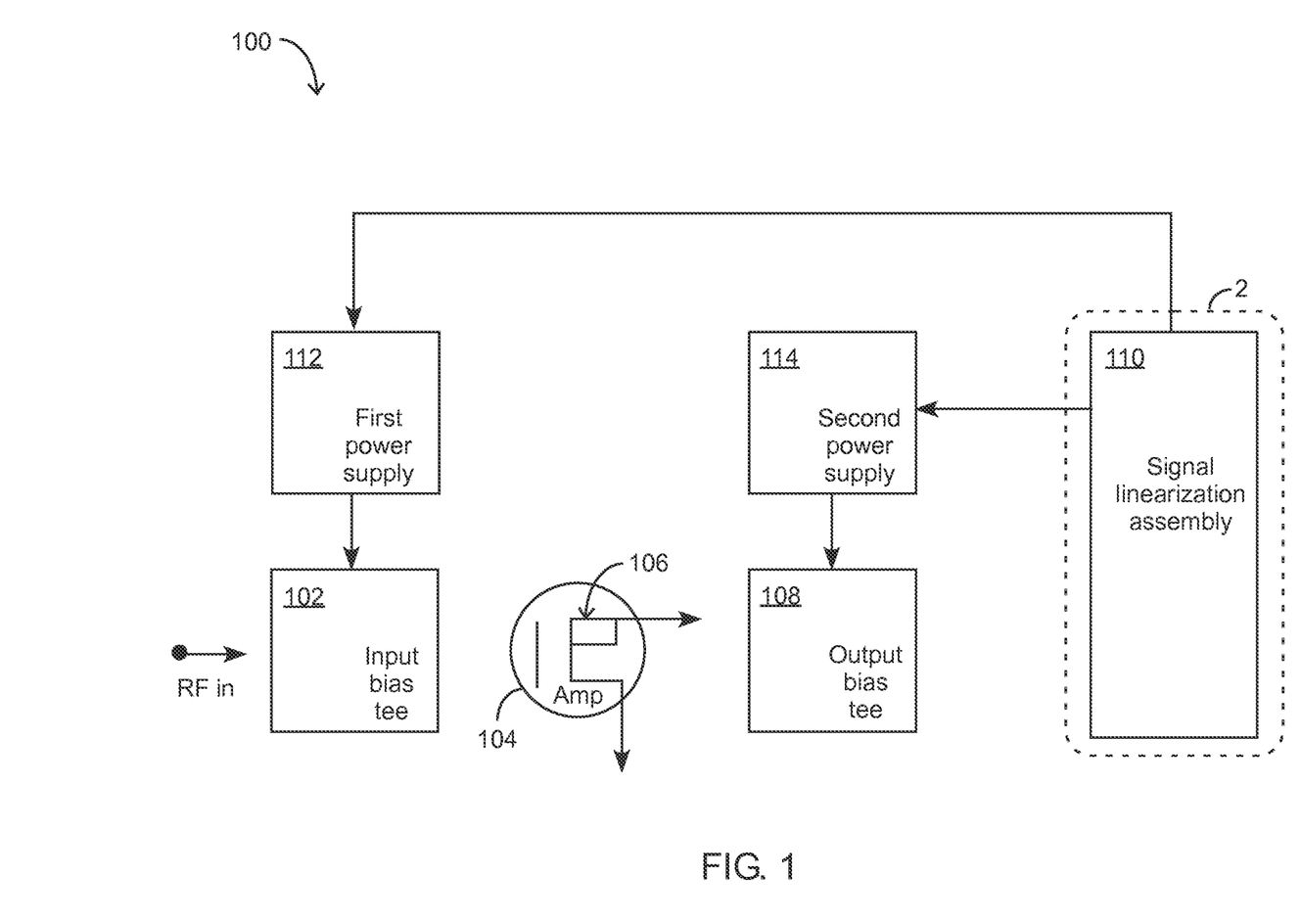
FIG. 1 is block diagram of an exemplary signal processing system.

FIG. 1 illustrates an exemplary signal processing system 100. In the exemplary embodiment, signal processing system 100 is an amplifier system that is configured to modify a signal by a transfer function, normally by increasing the power of the signal by a gain factor that is linearly applied across all frequencies in a pass band. The invention is also applicable to signal processing systems with transfer functions that are not algebraically linear but are nevertheless predetermined functions, in which case the term "linear" should be construed as meaning to conform to the predetermined transfer function. The terms "non-linear" and "distortion" refer to output signals or processed intermediate signals that depart from the predetermined transfer function at particular frequencies and potentially at the harmonics of those frequencies as well. Although the exemplary embodiment illustrates an amplifier system, the present disclosure is not limited to amplifier systems and one of ordinary skill in the art will appreciate that the current disclosure may be used in connection with other types of signal processing system that apply a transfer function to an input signal having components with amplitude and frequency characteristics, to obtain an output signal that ideally conforms to the product of the input signal and the transfer function but is subject to some form of distortion or error.

System 100 includes an input device or an input bias tee 102 that is configured to receive a signal from a signal source, such as an antenna (not shown). In some embodiments, the signal can be a radio frequency (RF) signal that is being transmitted from the antenna at a frequency ranging from about 10 Kilohertz to about 300,000 Megahertz. In the exemplary embodiment, input bias tee 102 is configured to combine the RF signal with an electrical bias signal, such as a direct current (DC) voltage. Input bias tee 102 can also be configured to combine alternating current (AC) signals with DC signals and/or to combine the AC components from the DC components and/or to combine higher and lower frequency components.

A signal modification device, such as an amplifier 104, is coupled to input bias tee 102. Amplifier 104 is configured to alter the input signal according to a transfer function, such as to apply a gain factor to multiply the voltage or current or numerically digitized amplitude of a signal received from input bias tee 102 to generate a modified output signal, such as an amplified signal. It should be noted that, as used herein, the term "couple" is not limited to a direct mechanical and/or an electrical connection between components, but may also include an indirect mechanical and/or electrical connection between two or more components or a coupling that is operative through intermediate elements or spaces. Amplifier 104 includes a transistor 106, such as a field-effect transistor (FET) or a bipolar-junction transistor (BJT), wherein transistor 106 is configured to be biased at an optimum voltage for amplification of the signal received from input bias tee 102. The modified output signal or the amplified signal may include a time varying parameter, such as a plurality of waves, representing a plurality of frequency components including at least one component caused by non-linear intermodulation distortion, such as odd-order intermodulation distortion, that can be introduced into the signal during the amplification.

In the exemplary embodiment, an output device or an output bias tee 108 is coupled to amplifier 104. Output bias tee 108 is configured to transmit the modified output signal or the amplified signal from amplifier 104 to a system linearization assembly 110 that is coupled to output bias tee 108. As explained in more detail below with respect to FIGS. 2 and 3, system linearization assembly 110 is configured to facilitate modifying or minimizing the non-linear intermodulation distortion component, such as an odd-order intermodulation distortion, based on the parameter(s) of at least one harmonic of the waves of the modified output signal.

System 100, also includes a plurality of power supplies. For example, system 100 includes a first power supply 112 that is coupled to system linearization assembly 110 and to input bias tee 102, and system 100 also includes a second power supply 114 that is coupled to system linearization assembly 110 and to output bias tee 108. In the exemplary embodiment, first power supply 112 is configured to supply DC voltages to input bias tee 102 and second power supply 114 is configured to supply DC voltages to output bias tee 108. As explained in more detail below with respect to FIGS. 2 and 3, system linearization assembly 110 is configured to control first power supply 112 and second power supply 114 such that the voltages being supplied to input bias tee 102 and output bias tee 108, respectively, can be adjusted as a means to amplify or attenuate or merely to follow the signal level as passing through the input and output bias tees 102, 108. This bias control can be configured as a voltage based control as mentioned or in other embodiments that control can be based on current bias, variable resistance, numeric scaling, etc.

During operation of system 100, at least one signal, such as an RF signal, is generated by a signal source, such as an antenna (not shown). The signal is transmitted from the antenna to input bias tee 102. Moreover, power supply 112 transmits a voltage, such as a DC voltage, to input bias tee 102. As such, input bias tee 102 is enabled to combine the recently received signal with the voltage. When the signal is combined with the voltage, a quiescent operating gate voltage ($V_g$) is set for the amplifier. Amplifier 104 then modifies the signal by amplifying the power of the signal and the amplified signal is transmitted to output bias tee 108 such that the signal can be transmitted to system linearization assembly 110.

The amplified signal includes a time varying parameter representing a plurality of frequency components including at least one component caused by non-linear intermodulation distortion, such as odd-order intermodulation distortion. Amplifier 104 exhibits some level of non-linear behavior which distorts the output signal. Odd-ordered intermodulation nonlinearity (IM3, IM5, etc.) is of particular concern because noise and other interference can become mixed with the signal within the amplifier passband. However, there are naturally occurring nulls in the output powers of the $n^{th}$ odd-ordered intermodulation (IM3, IM5, etc.) that occur when the weighted mean of the $n^{th}$ derivative of the amplifier voltage transfer curve is zero. Moreover, the output powers and position of naturally occurring nulls of these intermodulation components are dependent on a drain-source voltage quiescent voltage bias ($V_{sd}$) and a gate source voltage quiescent voltage bias ($V_g$). As such, the $3^{rd}$ order intermodulation (IM3) can be substantially reduced when the $3^{rd}$ derivative of the amplifier voltage transfer curve is zero. Therefore, as explained in more detail below, with respect to FIGS. 2 and 3, system linearization assembly 110 monitors the odd-numbered harmonic intensity of the amplified signal and adjusts amplifier bias voltages to minimize or substantially reduce the odd-order intermodulation distortion intensity (i.e., the non-linear intermodulation distortion component).

Figure 2:
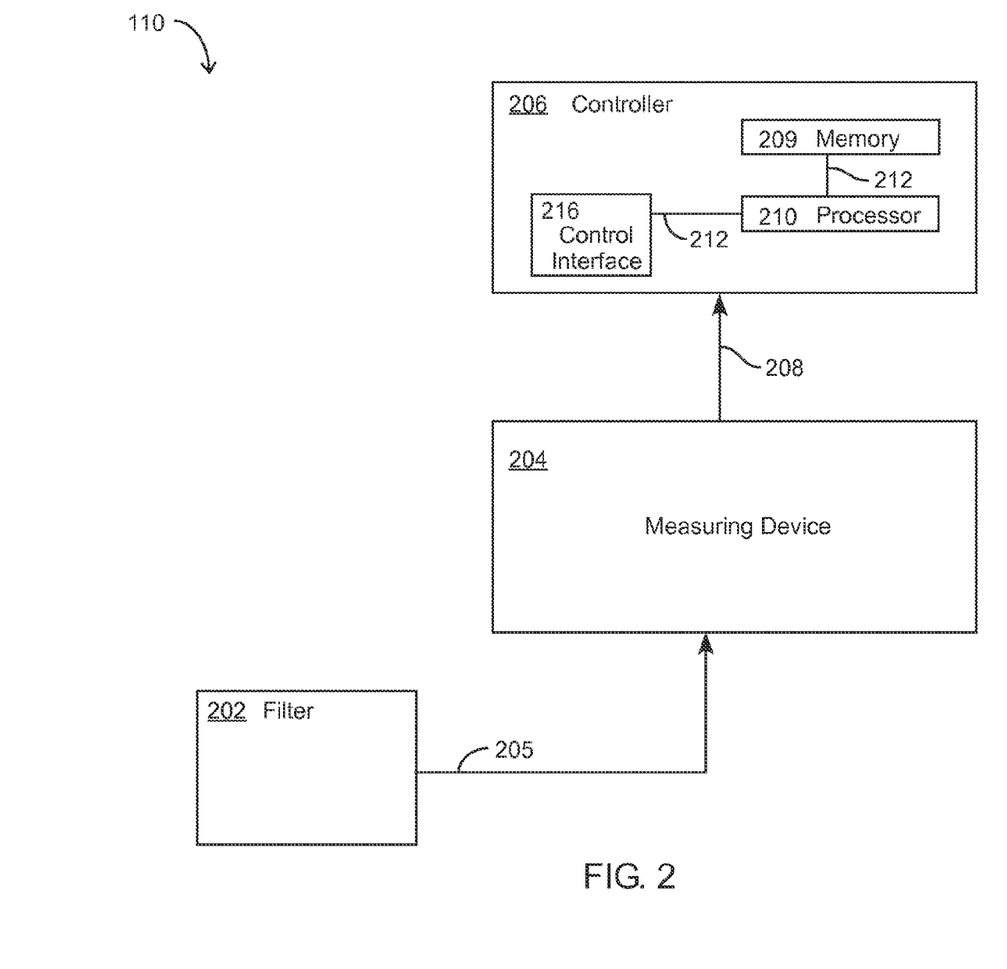
FIG. 2 is a block diagram of an exemplary system linearization assembly that may be used with the signal processing system shown in FIG. 1 and taken from area 2.

FIG. 2 illustrates system linearization assembly 110 taken from area 2 (shown in FIG. 1). In the exemplary embodiment, system linearization assembly 110 includes a filter 202 that is coupled to output bias tee 108 (shown in FIG. 1). In some embodiments, filter 202 may be incorporated with or integrally formed with output bias tee 108. In the exemplary embodiment, filter 202 is a harmonic output filter network that is configured to receive the modified output signal or the amplified output signal from the output bias tee 108 Filter 202 is also configured to isolate at least one harmonic that appears in the output signal, which is substantially proportional to at least one of the non-linear intermodulation distortion component of the modified output signal. Filter 202 is also configured to transmit the fundamental amplified signal to an output. Filter 202 is also configured to transmit the isolated harmonic signal to a separate output from the fundamental amplified signal.

In the exemplary embodiment, a measuring device 204 is coupled to filter 202 via conduit 205, and measuring device 204 is configured to receive at least one signal from filter 202 that is representative of the isolated harmonic(s) (hereinafter referred to as the "harmonic signal"). Measuring device (204) is also configured to have an input impedance such that the harmonic intensity, such as the harmonic power, measured after the filter (202) is substantially proportional to the harmonic intensity or harmonic power of the at least one component caused by non-linear intermodulation distortion after the filter (202). Measuring device 204 is also configured to determine a measurement of at least one parameter of the harmonic signal. For example, in the exemplary embodiment, measuring device 204 can be a radiometer that is configured to measure or determine the power or the amplitude of the harmonic.

System linearization assembly 110 also includes a controller 206 that is coupled to measuring device 204 via conduit 208. Controller 206 is further operatively coupled to vary the operation of first power supply 112 (shown in FIG. 1) and second power supply 114 (shown in FIG. 1) as a function of values determined from measuring device 204 such as the power or amplitude value of the harmonic signal. More specifically, controller 206 may be coupled to, for example, at least one controllable voltage regulator (not shown) in first power supply 112 and at least one controllable voltage regulator (not shown) in second power supply 114. Controller 206 is enabled to facilitate operative features of the controllable voltage regulators, via features that include, without limitation, receiving permissive inputs, transmitting permissive outputs, and transmitting opening and closing commands.

In the exemplary embodiment, controller 206 may be a real-time controller and may include any suitable processor-based or microprocessor-based system, such as a computer system, that includes microcontrollers, reduced instruction set circuits RISC), application-specific integrated circuits (ASICs), logic circuits, and/or any other circuit or processor that is capable of executing the functions described herein. In one embodiment, controller 206 may be a microprocessor that includes read-only memory (ROM) and/or random access memory (RAM), such as, for example, a 32 bit microcomputer with 2 Mbit ROM and 64 Kbit RAM. As used herein, the term "real-time" refers to outcomes occurring in a substantially short period of time after a change in the inputs affect the outcome, with the time period being a design parameter that may be selected based on the importance of the outcome and/or the capability of the system processing the inputs to generate the outcome. In this embodiment, the signal may be represented by time division samples of the amplitude or samples of the amplitude at discrete frequency bands, which characterize the input and measured output signals numerically.

Controller 206, in the exemplary embodiment, includes a memory device 209 that stores executable instructions and/or one or more operating parameters representing and/or indicating an operating condition of first power supply 112 and second power supply 114. Controller 206 also includes a processor 210 that is coupled to memory device 209 via a system bus 212. In one embodiment, processor 210 may include a processing unit, such as, without limitation, an integrated circuit (IC), an application specific integrated circuit (ASIC), a microcomputer, a programmable logic controller (PLC), and/or any other programmable circuit. Alternatively, processor 210 may include multiple processing units (e.g., in a multi-core configuration). The above examples are exemplary only, and thus are not intended to limit in any way the definition and/or meaning of the term "processor."

Moreover, in the exemplary embodiment, controller 206 includes a control interface 216 that is coupled to first power supply 112 and to second power supply 114. More specifically, control interface 216 is coupled to the controllable voltage regulators within first power supply 112 and within second power supply 114, and control interface 216 is configured to control an operation of the controllable voltage regulators. For example, processor 210 may be programmed to generate one or more control parameters that are transmitted to control interface 216. Control interface 216 may then transmit a control parameter to modulate, open, or close the controllable voltage regulators.

Various connections are available between control interface 216 and first power supply 112 and second power supply 114. Such connections may include, without limitation, an electrical conductor, a low-level serial data connection, such as Recommended Standard (RS) 232 or RS-485, a high-level serial data connection, such as USB, a field bus, a PROFIBUS®, or Institute of Electrical and Electronics Engineers (IEEE) 1394 (a/k/a FIREWIRE), a parallel data connection, such as IEEE 1284 or IEEE 488, a short-range wireless communication channel such as BLUETOOTH, and/or a private (e.g., inaccessible outside system 100) network connection, whether wired or wireless. PROFIBUS is a registered trademark of Profibus Trade Organization of Scottsdale, Ariz.

IEEE is a registered trademark of the Institute of Electrical and Electronics Engineers, Inc., of New York, N.Y. BLUETOOTH is a registered trademark of Bluetooth SIG, Inc. of Kirkland, Wash.

During operation, the modified output signal or the amplified signal having a time varying parameter, such as a plurality of waves, representing a plurality of frequency components including at least one component caused by non-linear intermodulation distortion, such as an intermodulation distortion component, is transmitted from output bias tee 108 to system linearization assembly 110. As explained in more detail below with respect to FIG. 3, filter 202 receives the output signal and isolates at least one harmonic of the frequency components signal. More specifically, filter 202 isolates the harmonic with the same order as the non-linear intermodulation distortion component. The isolated harmonic is generally an odd-numbered harmonic, such as the third harmonic. Measuring device 204 measures or determines at least one parameter of the harmonic, such as the power or amplitude of the harmonic. Measuring device 204 is also configured to have an input impedance such that the harmonic intensity or harmonic power measured after the filter is substantially proportional to the harmonic intensity or harmonic power of the at least one component caused by non-linear intermodulation distortion after the filter. Based on the determined measurement, controller 206 adjusts the voltages being supplied to input bias tee 102 and to output bias tee 108 by controlling the first power supply 112 and second power supply 114, respectively. When the voltages are adjusted, the harmonic is modified, for example by being minimized or substantially reduced. Because the harmonic signal is substantially proportional to the non-linear intermodulation distortion component, then as the harmonic is modified, for example by being minimized or substantially reduced, the intermodulation distortion (i.e., the non-linear intermodulation distortion component) is also minimized or substantially reduced.

Figure 3:
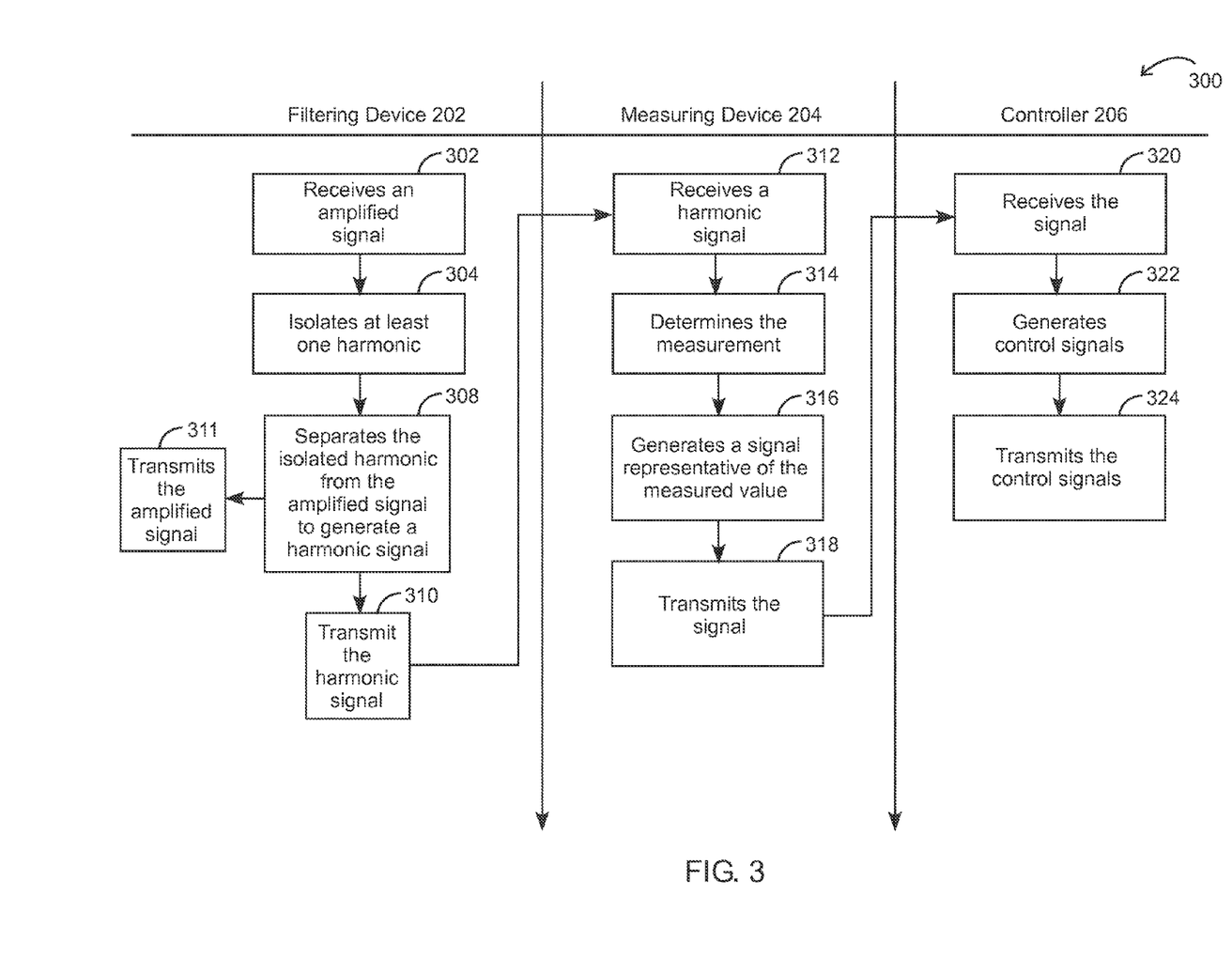
FIG. 3 is a swimlane diagram of an exemplary method of modifying distortion component(s) using the system linearization assembly shown in FIG. 2.

FIG. 3 is a swimlane diagram 300 of an exemplary method of modifying distortion component(s) using system linearization assembly 110 (shown in FIGS. 1 and 2). In step 302, filter 202 (shown in FIG. 2) receives a modified output signal or an amplified signal from output bias tee 108 (shown in FIG. 1), wherein the modified output signal or the amplified signal a time varying parameter, such as a plurality of waves, representing a plurality of frequency components including at least one component caused by non-linear intermodulation distortion (e.g., IMD). As described above, amplifier 104 (shown in FIG. 1) exhibits some level of non-linear behavior which distorts the modified output signal or the amplified signal.

In step 304, filter 202 isolates at least one harmonic of the frequency components (shown in FIG. 2). The isolated harmonic is generally an odd-numbered harmonic, such as the third harmonic. More specifically, as described above, odd-order intermodulation nonlinearity (IM3, IM5, etc.) is of particular concern. Moreover, the $3^{rd}$ harmonic/intermodulation component is usually the largest. As also described above, there are naturally occurring nulls in the odd-ordered intermodulation (IM$_3$, IM$_5$, etc.) output powers that occur when the weighted mean of the nth derivative of the amplifier voltage transfer curve is zero, and the output powers are dependent on drain-source voltage quiescent voltage bias ($V_{sd}$) and a gate source voltage quiescent voltage bias ($V_g$).

Filter 202 then generates a signal that is representative of the isolated harmonic (i.e., the harmonic signal). More specifically, in step 308, filter 202 separates the isolated harmonic from the modified output signal or the amplified signal to generate the harmonic signal. Filter 202 transmits the harmonic signal to measuring device 204 (shown in FIG. 2) in step 310. In step 311, filter 202 transmits the modified output signal or the amplified signal, which is still distorted with, for example, IM3, to a separate port (not shown) and can later be transmitted to, for example, an antenna (not shown) or to a transmitter (not shown) or other output.

In step 312, measuring device 204 receives the harmonic signal. In step 314, measuring device 204 determines the measurement of at least one parameter of the harmonic signal. For example, measuring device 204 determines or measures the power or amplitude of the harmonic signal. In some embodiments, measuring device 204 is configured to have an input impedance such that the harmonic intensity measured after the filter is substantially proportional to the intensity of the at least one component caused by non-linear intermodulation distortion after the filter. In some embodiments, measuring device 204 can also be phase sensitive. For example, the phase of the harmonic signal can change by 180 degrees when the minimum value of the harmonic amplitude is reached and/or crossed. If measuring device 204 is phase sensitive, and this phase information is passed or transmitted to controller 206 (shown in FIG. 2), controller 206 can gain an additional way of knowing which direction to adjust the bias voltages to minimize the harmonic signal. In step 316, measuring device 204 generates a signal representative of the measured value and, in step 318, measuring device 204 transmits the signal of the measured value to controller 206 (shown in FIG. 2).

In step 320, controller 206 receives the signal of the measured value. Based on the measured value, controller 206 modifies the output signal by adjusting the voltages being provided to input bias tee 102 (shown in FIG. 1) and output bias tee 108. More specifically, based on the measured value, controller 206 generates control signals in step 322. These control signals are directed at controlling the controllable voltage regulators (not shown) within first power supply 112 (shown in FIG. 1) and second power supply 114 (shown in FIG. 1) such that voltages (i.e., DC voltages) being supplied by first power supply 112 to input bias tee 102 and by second power supply 114 to output bias tee 108 can be adjusted. In step 324, controller 206 transmits the control signals to first power supply 112 and to second power supply 114 via control interface 216 (shown in FIG. 2). For example, based on the measured value, controller 206 can generate control signals to decrease the power supply. As such, the control signals adjust the controllable attenuators in first power supply 112 and second power supply 114 such that the power supply being transmitted to input bias tee 102 and to output bias tee 108, respectively, is substantially reduced. This reduction would cause the identified harmonic to decrease or be minimized. Since the identified harmonic (i.e., the third harmonic) and the non-linear intermodulation distortion component (i.e., IM3) are substantially proportional, then by decreasing or minimizing the harmonic, the non-linear intermodulation distortion component is also decreased or minimized.

As compared to known systems, such as amplifier linearization systems, that merely "cover" or "patch" non-linear intermodulation distortion components within signals to compensate for the effects of the non-linear components, the embodiments described herein provide a system linearization assembly that can be used with such systems to facilitate a reduction or minimization of the non-linear intermodulation distortion components from the system itself. The system linearization assembly is configured to receive a signal, such as a modified or amplified signal, wherein the signal includes a time varying parameter representing a plurality of frequency components including at least one component caused by non-linear intermodulation distortion, such as odd-order intermodulation distortion. The system linearization assembly is further configured to isolate at least one harmonic of frequency components, such as at least one odd numbered harmonic, with the same order as the component caused by non-linear intermodulation distortion. The system linearization assembly is also configured to determine a measurement of at least one parameter of the isolated harmonic, and to modify the signal based on the determined measurement. Such a modification facilitates a reduction or minimization of the component caused by non-linear intermodulation distortion from the signal processing system itself rather than merely "covering" or "patching" the non-linear intermodulation distortion component to hide its effects.

Exemplary embodiments of the assemblies, systems, and methods are described above in detail. The assemblies, systems, and methods are not limited to the specific embodiments described herein, but rather, components of the assemblies, systems, and/or steps of the method may be utilized independently and separately from other components and/or steps described herein. For example, the assembly may also be used in combination with other systems and methods, and is not limited to practice with only a system as described herein. Rather, the exemplary embodiment can be implemented and utilized in connection with many other systems.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system linearization assembly comprising:
    a filter configured to couple to an output bias tee, wherein said filter is further configured to:
        receive a signal that includes a time varying parameter representing a plurality of frequency components including at least one component caused by non-linear intermodulation distortion; and
        isolate at least one harmonic of the plurality of frequency components with the same order as the at least one component caused by non-linear intermodulation distortion, wherein the isolated at least one harmonic is substantially proportional to the at least one component caused by non-linear intermodulation distortion; and
    a measuring device coupled to said filter, wherein said measuring device is configured to determine a measurement of at least one parameter of the isolated at least one harmonic; and
    a controller coupled to said measuring device, wherein said controller is configured to modify the signal from the determined measurement to facilitate a modification of the at least one component caused by non-linear intermodulation distortion.

2. A system linearization assembly in accordance with claim 1, wherein said filter is configured to separate the isolated at least one harmonic from the signal.

3. A system linearization assembly in accordance with claim 1, wherein said filter is configured to isolate at least one odd numbered harmonic of the plurality of frequency components, wherein the at least one odd numbered harmonic is substantially proportional to the at least one component caused by non-linear intermodulation distortion.

4. A system linearization assembly in accordance with claim 1, wherein said measuring device is configured to determine the measurement of the power of the isolated at least one harmonic.

5. A system linearization assembly in accordance with claim 4, wherein said measuring device is further configured to have an input impedance such that the harmonic power measured after said filter is substantially proportional to the power of the at least one component caused by non-linear intermodulation distortion after said filter.

6. A system linearization assembly in accordance with claim 1, wherein said measuring device is configured to be phase sensitive.

7. A system linearization assembly in accordance with claim 1, wherein said controller is configured to modify the signal by being configured to adjust at least one voltage based on the determined measurement.

8. A system linearization assembly in accordance with claim 7, wherein said controller is configured to adjust the at least one voltage by being configured to control at least one voltage regulator within at least one power supply.

9. A signal processing system comprising:
    a signal modifying device that is configured to receive a signal from a signal source and to modify the signal to generate a modified output signal, wherein the modified output signal includes a time varying parameter representing a plurality of frequency components including at least one component caused by non-linear intermodulation distortion; and
    a system linearization assembly coupled to said signal modifying device, wherein said system linearization assembly comprises:
        a filter configured to:
            couple to an output bias tee;
            receive the modified output signal; and
            isolate at least one harmonic of the plurality of frequency components with the same order as the at least one component caused by non-linear intermodulation distortion, wherein the isolated at least one harmonic is substantially proportional to the at least one component caused by non-linear intermodulation distortion;
        a measuring device coupled to said filter, wherein said measuring device is configured to determine a measurement of at least one parameter of the isolated at least one harmonic; and
        a controller coupled to said measuring device, wherein said controller is configured to modify the signal from the determined measurement to facilitate a modification of the at least one component caused by non-linear intermodulation distortion.

10. A signal processing system in accordance with claim 9, wherein said filter is configured to separate the isolated at least one harmonic from the modified output signal.

11. A signal processing system in accordance with claim 9, wherein said filter is configured to isolate at least one odd numbered harmonic of the plurality of frequency components, wherein the at least one odd numbered harmonic is substantially proportional to the at least one component caused by non-linear intermodulation distortion.

12. A signal processing system in accordance with claim 9, wherein said measuring device is configured to determine the measurement of the power of the isolated at least one harmonic.

13. A signal processing system in accordance with claim 12, wherein said measuring device is further configured to have an input impedance such that the harmonic power measured after said filter is substantially proportional to the power of the at least one component caused by non-linear intermodulation distortion after said filter.

14. A signal processing system in accordance with claim 9, wherein said measuring device is configured to be phase sensitive.

15. A signal processing system in accordance with claim 9, wherein said controller is configured to modify the signal by being configured to adjust at least one voltage based on the determined measurement.

16. A signal processing system in accordance with claim 15, wherein said controller is configured to adjust the at least one voltage by being configured to control at least one voltage regulator within at least one power supply.

17. A method for modifying distortion components, said method comprising:
    receiving a signal that includes a time varying parameter representing a plurality of frequency components including at least one component caused by non-linear intermodulation distortion, via a filter that is configured to couple to an output bias tee;
    isolating at least one harmonic of the plurality of frequency components with the same order as the at least one component caused by non-linear intermodulation distortion, via the filter, wherein the isolated at least one harmonic is substantially proportional to the at least one component caused by non-linear intermodulation distortion;
    determining a measurement of at least one parameter of the isolated at least one harmonic, via a measuring device that is coupled to the filter; and
    modifying the signal from the determined measurement to facilitate a modification of the at least one component caused by non-linear intermodulation distortion, via a controller coupled to the measuring device.

18. A method in accordance with claim 17, further comprising separating the isolated at least one harmonic from the signal, via the filter.

19. A method in accordance with claim 17, wherein isolating at least one harmonic of the plurality of frequency components with the same order as the at least one component caused by non-linear intermodulation distortion comprises isolating at least one odd numbered harmonic.

20. A method in accordance with claim 17, wherein determining a measurement of at least one parameter of the isolated at least one harmonic comprises determining a measurement of the power of the harmonic.

21. A method in accordance with claim 17, wherein modifying the signal comprises adjusting at least one voltage based on the determined measurement.

22. A method in accordance with claim 21, wherein adjusting at least one voltage comprises controlling at least one voltage regulator within at least one power supply.

* * * * *